United States Patent
Shinoda

(10) Patent No.: US 9,340,168 B2
(45) Date of Patent: May 17, 2016

(54) ELECTRONIC APPARATUS FOR VEHICLE

(71) Applicant: DENSO CORPORATION, Kariya, Aichi-pref. (JP)

(72) Inventor: Takuya Shinoda, Nagoya (JP)

(73) Assignee: DENSO CORPORATION, Kariya (JP)

( * ) Notice: Subject to any disclaimer, the term of this patent is extended or adjusted under 35 U.S.C. 154(b) by 339 days.

(21) Appl. No.: 13/975,684

(22) Filed: Aug. 26, 2013

(65) Prior Publication Data

US 2013/0335919 A1     Dec. 19, 2013

Related U.S. Application Data

(62) Division of application No. 13/009,054, filed on Jan. 19, 2011, now Pat. No. 8,699,231.

(30) Foreign Application Priority Data

Feb. 26, 2010  (JP) .................................. 2010-41603

(51) Int. Cl.
  *B60R 16/00*     (2006.01)
  *H05K 5/00*      (2006.01)
  *H05K 5/02*      (2006.01)

(52) U.S. Cl.
  CPC .............. *B60R 16/00* (2013.01); *H05K 5/0047* (2013.01); *H05K 5/0213* (2013.01)

(58) Field of Classification Search
  CPC ..... B60R 16/00; H05K 5/0047; H05K 5/0213
  USPC ........................ 361/679.46–679.54, 688–723; 165/80.2; 257/712–713; 174/547, 50.5; 312/236; 220/371
  See application file for complete search history.

(56) References Cited

U.S. PATENT DOCUMENTS

| 4,482,077 A | 11/1984 | Henderson |
| 6,297,448 B1 | 10/2001 | Hara |
| 7,189,918 B2 | 3/2007 | Sakata |

(Continued)

FOREIGN PATENT DOCUMENTS

| JP | 2000-138469 A | 5/2000 |
| JP | 2000-216555 A | 8/2000 |

(Continued)

OTHER PUBLICATIONS

Office Action mailed Sep. 9, 2013 in corresponding U.S. Appl. No. 13/009,054.

(Continued)

*Primary Examiner* — Zachary M Pape
(74) *Attorney, Agent, or Firm* — Posz Law Group, PLC

(57) ABSTRACT

An electronic apparatus for a vehicle, includes an electronic device, a waterproof housing that receives the electronic device, and a filter. The housing has a ventilation hole that penetrates through a housing wall of the housing. The filter is attached to a filter attachment portion of the housing wall to cover the ventilation hole. A wall surface of the ventilation hole includes a slope surface section that has an increasing cross-sectional area, which progressively increases from an inner end to an outer end of the slope surface section toward an outer surface of the housing wall in a penetrating direction of the ventilation hole. Furthermore, a distance between the filter attachment portion and the outer surface is larger than that between the inner end of the slope surface section and the outer surface in the penetrating direction.

9 Claims, 9 Drawing Sheets

(56) References Cited

U.S. PATENT DOCUMENTS

| | | |
|---|---|---|
| 7,253,356 B2 | 8/2007 | Kiyota et al. |
| 7,442,334 B2 | 10/2008 | Hara et al. |
| 7,626,129 B2 | 12/2009 | Sasaki et al. |
| 7,838,768 B2 | 11/2010 | Zadach et al. |
| 7,936,566 B2 | 5/2011 | Shigyo et al. |
| 8,014,158 B2 | 9/2011 | Kojima |
| 2007/0109730 A1 | 5/2007 | Shigyo et al. |
| 2007/0134981 A1 | 6/2007 | Shinoda et al. |
| 2008/0074840 A1 | 3/2008 | Suzuki |
| 2010/0103632 A1 | 4/2010 | Kato |
| 2011/0170260 A1 | 7/2011 | Sarginger |

FOREIGN PATENT DOCUMENTS

| | | |
|---|---|---|
| JP | 2001-135945 A | 5/2001 |
| JP | 2002-016371 A | 1/2002 |
| JP | 2002-016374 A | 1/2002 |
| JP | 2004-356524 A | 12/2004 |
| JP | 2005-129861 A | 5/2005 |
| JP | 2005-158909 A | 6/2005 |
| JP | 2006-287313 A | 10/2006 |
| JP | 2008-055981 A | 3/2008 |
| JP | 2008-237949 A | 10/2008 |
| JP | 2009-006808 A | 1/2009 |

OTHER PUBLICATIONS

Office Action mailed Apr. 23, 2013 issued by the Japan Patent Office in the corresponding Japanese application No. 2010-041603 (and English translation).

Office Action dated Jun. 21, 2013 issued by the State Intellectual Property Office of the People's Republic of China in the corresponding Chinese patent application No. 201110048724.X (and English translation).

Office Action mailed Jan. 21, 2014 issued in corresponding JP patent application No. 2013-125868, which is the divisional application of JP patent application No. 2010-041603 (and English translation).

Office Action mailed May 7, 2014 issued in corresponding JP patent application No. 2013-125868, which is the divisional application of JP patent application No. 2010-041603 (and English translation).

t0 : 1.4mm,  D3 : 4mm

| SAMPLE | DRAWING | θ1 | t1 (mm) | D1 (mm) | D2 (mm) | D2 > D1/2? | CONTACT CONNECTING SURFACE SECTION? | D4 (mm) |
|---|---|---|---|---|---|---|---|---|
| A1 | FIG. 5 | 10° | 0.5 | 4 | 2.84 | ○ | × | 1.16 |
| A2 | FIG. 5 | 20° | 0.5 | 4 | 1.37 | × | × | 1.37 |
| A3 | FIG. 5 | 30° | 0.5 | 4 | 0.87 | × | × | 0.87 |
| A4 | FIG. 5 | 10° | 1.0 | 4 | 5.67 | ○ | ○ | — |
| A5 | FIG. 5 | 20° | 1.0 | 4 | 2.75 | ○ | × | 1.25 |
| A6 | FIG. 5 | 30° | 1.0 | 4 | 1.73 | × | × | 1.73 |
| A7 | FIG. 13 | 10° | 0.5 | 2.5 | 2.84 | ○ | × | 0.41 |
| A8 | FIG. 13 | 10° | 1.0 | 2.5 | 5.67 | ○ | ○ | — |

FIG. 18
t0 : 1.4mm, D3 : 4mm
| SAMPLE | DRAWING | 1ST SLOPE PORTION | t1 (mm) | D1 (mm) |
|---|---|---|---|---|
| B | FIG. 10 | R0.7 | 0.7 | 4 |
| C1 | FIG. 8 | R0.7 | 0.7 | 4 |
| C2 | FIG. 15 | R0.9 | 0.5 | 2.5 |
| C3 | FIG. 15 | R0.4 | 1.0 | 2.5 |
FIG. 19
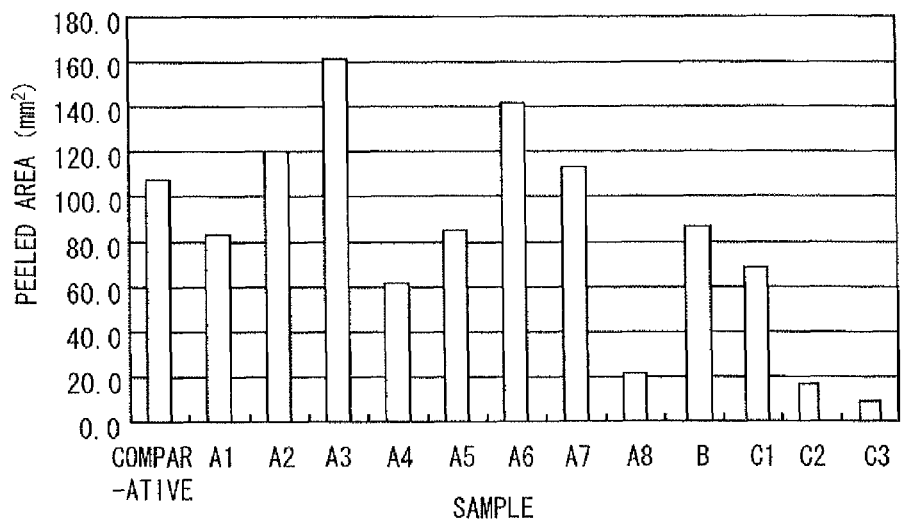
FIG. 20
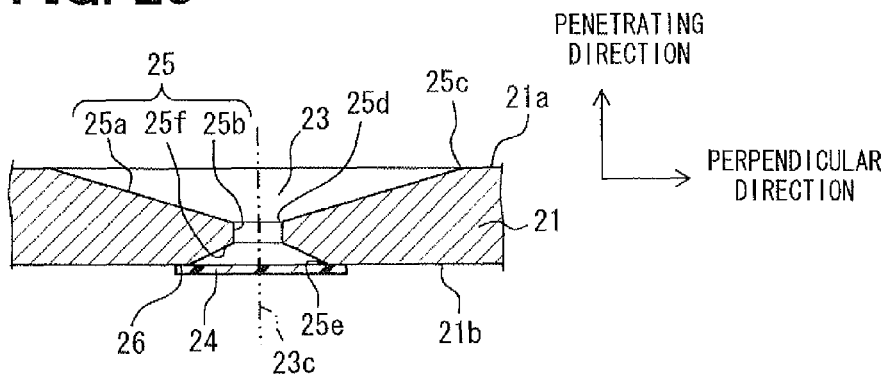

ELECTRONIC APPARATUS FOR VEHICLE

CROSS REFERENCE TO RELATED APPLICATIONS

The present application is a divisional of application Ser. No. 13/009,054 filed on Jan. 19, 2011 which is based on and claims priority to Japanese Patent Application No. 2010-41603 filed on Feb. 26, 2010, the disclosure of which is incorporated herein by reference.

FIELD OF THE INVENTION

The present invention relates to an electronic apparatus for a vehicle.

BACKGROUND OF THE INVENTION

Conventionally, an electronic control unit, which is exposed to a high-pressure water flow in washing a vehicle, such as an electronic control unit that is arranged in an engine room of a vehicle and performs control of an engine is well known. For example, as described in JP-A-2008-55981 and JP-A-2009-6808, a waterproof housing includes a ventilation hole and a sheet-like filter for covering the ventilation hole.

In an electronic control unit (waterproof device) described in JP-A-2008-55981, a filter membrane is attached to an outer surface of a cover (waterproof housing) by an adhesive sheet having multiple micropores so that a ventilation hole (through-hole) is closed. The adhesive sheet and the filter membrane correspond to the above-described filter.

In an electronic control unit (waterproof device) described in JP-A-2009-6808, a recess is formed in an upper surface side of a case (waterproof housing) having a ventilation hole (through-hole) to surround the ventilation hole, and a sheet-like breathing filter (filter) is attached to a bottom surface of the recess to cover the ventilation hole (through-hole).

However, in the configurations described in JP-A-2008-55981 and JP-A-2009-6808, a high-pressure water flow at an unchanged impetus may be directly poured on the sheet-like filter attached to the waterproof housing, as described above. Thus, there is a problem that the filter is easily peeled off.

If the filter is peeled off, water or the like enters into the waterproof housing, and thus, a short-circuit may occur in a circuit board or the like, or an electronic device may break down.

SUMMARY OF THE INVENTION

In view of the above-described problem, it is an object of the present invention to provide an electronic apparatus for a vehicle, in which peel-off of a sheet-like filter due to a high-pressure water flow can be effectively suppressed.

According to one aspect of the present invention, an electronic apparatus for a vehicle, includes at least one electronic device, a waterproof housing, and a filter. The waterproof housing receives the at least one electronic device in an interior of the waterproof housing. A ventilation hole penetrates through a housing wall of the waterproof housing from an inner surface to an outer surface of the housing wall in a penetrating direction thereof to communicate between an outside and an inside of the waterproof housing. The filter is generally planar and is attached to a filter attachment portion of the housing wall to cover the ventilation hole. A wall surface of the ventilation hole includes a slope surface section that has an increasing cross-sectional area, which progressively increases from an inner end to an outer end of the slope surface section toward the outer surface of the housing wall in the penetrating direction of the ventilation hole. A distance between the filter attachment portion and the outer surface of the housing wall measured in the penetrating direction of the ventilation hole is larger than a distance between the inner end of the slope surface section and the outer surface of the housing wall measured in the penetrating direction of the ventilation hole.

In this manner, by configuring the ventilation hole such that the distance between the filter attachment portion and the outer surface of the housing wall is larger than that between the inner end of the slope surface section and the outer surface of the housing wall in the penetrating direction of the ventilation hole, it becomes difficult for a high-pressure water flow with a small incident angle to be directly poured on the filter because of at least a thickness of the slope surface section in the penetrating direction. That is, it is especially important to suppress a high-pressure water flow with a large incident angle (for example, a high-pressure water flow with the incident angle of 90° along the penetrating direction of the ventilation hole) so as to restrain the peel-off of the filter.

In contrast, in the present invention, the wall surface of the ventilation hole includes the slope surface section that has the increasing cross-sectional area, which progressively increases from the inner end to the outer end of the slope surface section toward the outer surface of the housing wall in the penetrating direction of the ventilation hole. A high-pressure water flow with a large incident angle (for example, the high-pressure water flow along the penetrating direction of the ventilation hole) is reflected on the slope surface section and the reflected water flows hit against each other above the filter. Therefore, an impetus (i.e., pressure) of the water flow that is going to directly hit against the filter is weakened.

Furthermore, if water is stored in the ventilation hole with the filter used as an end surface, the stored water functions as a cushion against the high-pressure water flow. Thus, the high-pressure water flow can be restrained from directly hitting against the filter despite the incident angle of the high-pressure water flow.

Accordingly, in the waterproof housing, the peel-off of the filter due to the high-pressure water flow can be restrained.

BRIEF DESCRIPTION OF THE DRAWINGS

The above and other objects, features and advantages of the present invention will become more apparent from the following detailed description made with reference to the accompanying drawings. In the drawings:

FIG. 18 is a table showing details of samples B and C1 to C3 in the samples used for the peel test of the filter;

FIG. 19 is a graph showing a relation between a peeled area due to a high-pressure water flow and each of the samples A1 to A8, B and C1 to C3;

FIG. 20 is a cross-sectional view showing another modified example of the connecting surface section;

DETAILED DESCRIPTION OF THE PREFERRED EMBODIMENTS

Hereinafter, an embodiment of the present invention will be described with reference to drawings.

Embodiment

The present embodiment shows an example of a waterproof housing used for an engine ECU (Electric Control Unit) for a vehicle as a waterproof housing, and an example of an electronic control unit having a waterproof structure used for the engine ECU as a waterproof device.

Figure 2:
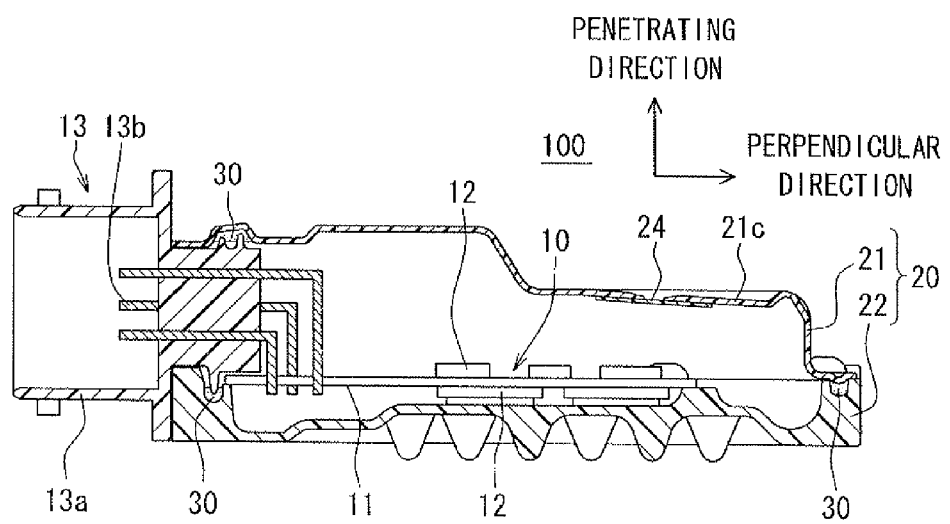
FIG. 2 is a cross-sectional view taken along the line II-II of FIG. 1.

In addition, in the present embodiment, as shown in FIG. 2 and the like, a penetrating direction of a ventilation hole is referred to as a penetrating direction, and a direction perpendicular to the penetrating direction is referred to as a perpendicular direction.

Figure 1:
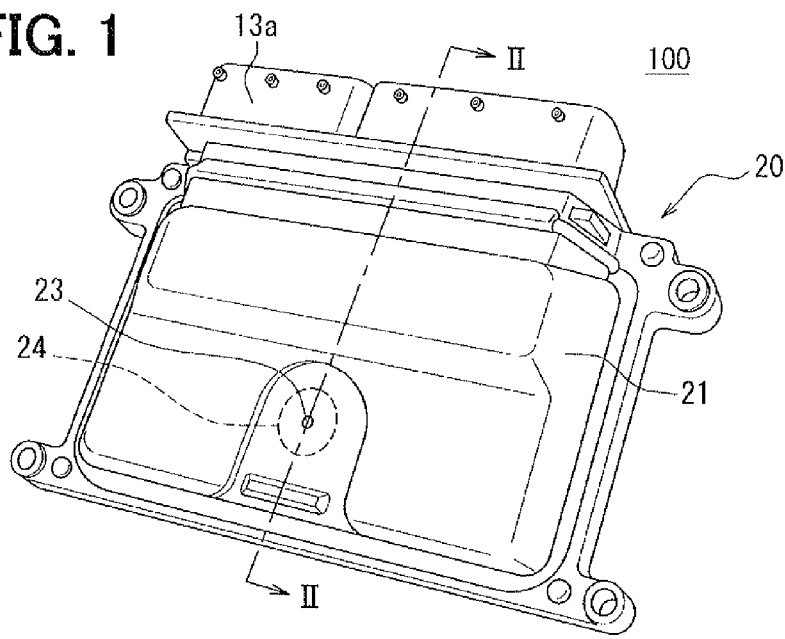
FIG. 1 is a perspective view showing a structure of an electronic control unit according to an embodiment of the present invention.

An electronic control unit 100 shown in FIGS. 1 and 2 includes, as main components, a circuit board 10 having a substrate 11 to which electronic devices 12 are installed, a waterproof housing 20 that houses the circuit board 10, and a breathing filter 24 attached to the waterproof housing 20. In the present embodiment, in addition to the above-described components, the electronic control unit 100 includes a sealing member 30. Since the filter 24 is integrated with the waterproof housing 20 in the state where the filter 24 is attached to the waterproof housing 20, hereinafter, the filter 24 will be described with the waterproof housing 20.

The electronic devices 12 such as a microcomputer, a power transistor, a resistor, and a capacitor are installed to the substrate 11, in which wirings including lands as electrodes and via holes for connecting the wirings are formed, thereby providing the circuit board 10 in which a circuit is configured. In the present embodiment, the electronic devices 12 include a pressure sensor.

A connector 13 that electrically connects the circuit configured in the circuit board 10 to an external device or the like is installed to the substrate 11. In the connector 13, a reference numeral 13a in FIG. 2 denotes a housing made of electrical insulating material, and a reference numeral 13b denotes a terminal made of electrical conducting material, a part of which is supported by the housing 13a. FIG. 2 shows an example that the terminal 13b of the connector 13 is inserted and installed to the substrate 11. However, an installation structure is not limited to the above example, and a surface mount structure can be applied. In addition, in FIG. 2, through-holes, into which the terminal 13b is inserted, and the lands are omitted from the substrate 11, and solder that connects the lands to the terminal 13b is also omitted.

The waterproof housing 20 is made of metal material such as aluminum and iron or resin material. The waterproof housing 20 houses the circuit board 10 therein to protect the circuit board 10. The number of components for configuring the waterproof housing 20 is not specifically limited. The waterproof housing 20 may include one component, or may include multiple components.

In the present embodiment, as shown in FIG. 2, the waterproof housing 20 includes a box-shaped case 21, one surface of which is opened, and a shallow base 22 that closes the opening portion of the case 21. The case 21 and the base 22 are fixed to each other so that the waterproof housing 20 having an internal space, in which the circuit board 10 is housed, is formed. A dividing direction of the waterproof housing 20 including the case 21 and the base 22 is not specifically limited. In the present embodiment, as shown in FIG. 2, the waterproof housing 20 is divided into two parts, that is, the case 21 and the base 22, in the penetrating direction.

Figure 3:
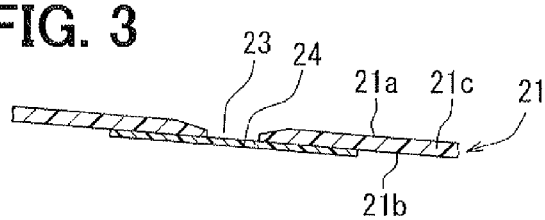
FIG. 3 is an enlarged cross-sectional view showing a ventilation hole and a periphery of a filter.

As shown in FIG. 3, the waterproof housing 20 has a ventilation hole 23, and the waterproof filter 24 that covers the ventilation hole 23 is attached to the waterproof housing 20. The ventilation hole 23 penetrates through a housing wall 21c of the waterproof housing 20 from an inner surface 21b to an outer surface 21a of the housing wall 21c in a penetrating direction thereof.

The ventilation hole 23 is an air hole for ventilating the internal space and the external space of the waterproof housing 20. A formed position of the ventilation hole 23 is not specifically limited. By forming the ventilation hole 23, even when a temperature inside or outside the waterproof housing 20 is changed and thus a pressure inside or outside the waterproof housing 20 is changed, the pressure inside the waterproof housing 20 becomes substantially the same as the pressure outside the waterproof housing 20, and deformation of the case 21 and the base 22 is suppressed.

Furthermore, since the pressure inside the waterproof housing 20 becomes substantially the same as the pressure outside the waterproof housing 20 (i.e., atmosphere pressure) by forming the ventilation hole 23, the pressure sensor as the electronic device 12 installed to the substrate 11 can operate normally.

The ventilation hole 23 can be formed when the waterproof housing 20 is fabricated by casting such as press molding and aluminum die-casting, and injection molding of resin. Alternatively, the ventilation hole 23 can be formed by a post-processing step by the use of a drill or a laser after the waterproof housing 20 is fabricated.

In contrast, the filter 24 is formed to suppress a decrease in a waterproof property of the waterproof housing 20, which is resulted from the formation of the ventilation hole 23 for adjusting a pressure. The filter 24 is formed to be generally planar (sheet-like shape) and is made of water-shedding fibrous material so as to restrain liquid such as water from passing through the filter 24 and make only gas pass through the filter 24. The filter 24 has the waterproof property enough to withstand a high-pressure water flow, such as a vehicle washer. In the present embodiment, since the electronic control unit 100 is arranged in an engine room of the vehicle, the filter 24 has an oil-shedding property in addition to the water-shedding property and the ventilation property.

In the present embodiment, as shown in FIG. 3, the ventilation hole 23 is formed in the housing wall 21c of the case 21 of the waterproof housing 20 along a thickness direction of the case 21 from the inner surface 21b to the outer surface 21a. More specifically, one ventilation hole 23 is formed in the bottom of the box-shaped case 21. The filter 24 is attached to the inner surface 21b of the case 21 with adhesive tape (not shown) so as to close the ventilation hole 23.

In the case 21 and the base 22 configuring the waterproof housing 20, a cutting portion (not shown) for the connector, which corresponds to the housing 13a of the connector 13, is formed. The substrate 11 including the electronic devices 12 and a part of the terminal 13b of the connector 13, which is connected to the substrate 11, are housed in the waterproof housing 20. The other part of the terminal 13b of the connector 13, which is connected to an external connector, is exposed to the outside of the waterproof housing 20.

Although not shown, in the state where the case 21 is fixed to the base 22, a part of the substrate 11 is directly or indirectly sandwiched between the case 21 and the base 22, and thus, the circuit board 10 is supported at a predetermined position in the waterproof housing 20. In the present embodiment, in the fixing state of the circuit board 10, a thickness direction of the substrate 11 configuring the circuit board 10 corresponds to the penetrating direction.

The waterproof sealing member 30 is arranged at a position where the case 21 and the base 22 are opposed to each other in peripheral portions of the case 21 and the base 22. Moreover, the sealing member 30 is arranged at a position where the housing 13a of the connector 13 and the case 21 are opposed to each other, and at a position where the housing 13a of the connector 13 and the base 22 are opposed to each other.

Next, a fixation structure of the filter 24 to a wall surface 25 of the case 21 having the ventilation hole 23, which is a characterizing portion of the present invention, will be described.

Figure 4:
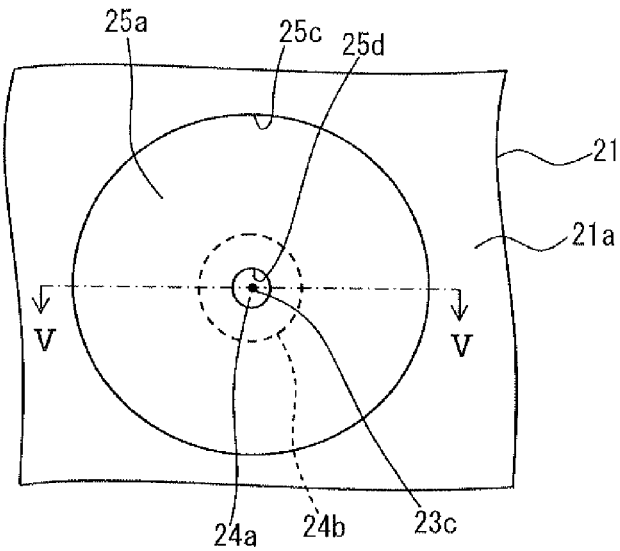
FIG. 4 is an enlarged plan view showing the ventilation hole and the periphery of the filter.
Figure 5:
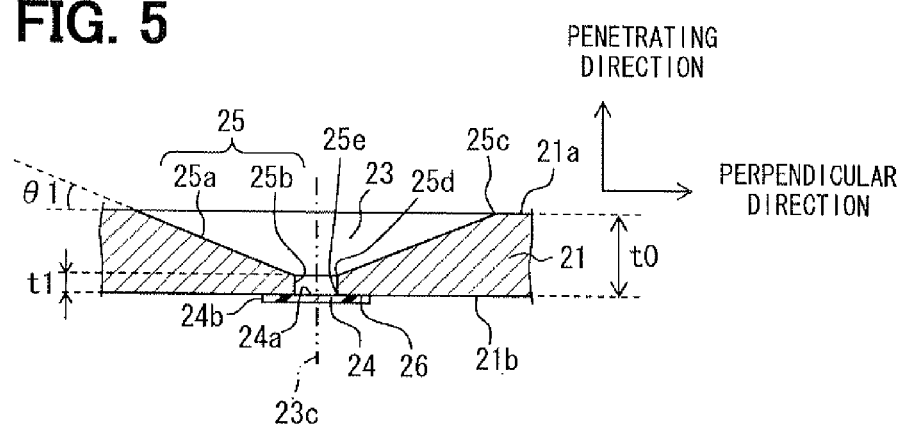
FIG. 5 is a cross-sectional view taken along the line V-V of FIG. 4.

As shown in FIGS. 4 and 5, the case 21 includes the wall surface 25 as a portion configuring the ventilation hole 23, that is, a portion configuring a wall surface of the ventilation hole 23.

The wall surface 25 includes a first slope surface section 25a and a cylindrical surface section 25b. The inclination of the first slope surface section 25a and that of the cylindrical surface section 25b are different from each other with respect to the perpendicular direction.

The first slope surface section 25a is a sloping portion of the wall surface 25. The first slope surface section 25a is formed such that a cross-sectional area thereof is increased with distance from the filter 24 in the penetrating direction. That is, the first slope surface section 25a has an increasing cross-sectional area, which progressively increases from an inner end to an outer end of the first slope surface section 25a toward the outer surface 21a of the housing wall 21c in the penetrating direction of the ventilation hole 23. In contrast, the cylindrical surface section 25b is a portion of the wall surface 25, which is formed such that a cross-sectional area thereof is constant in the penetrating direction. That is, the cylindrical surface section 25b has a generally constant cross-sectional area along an entire extent of the cylindrical surface section 25b. In addition, the cross-sectional area of each of the first slope surface section 25a and the cylindrical surface section 25b is a cross-sectional area along the perpendicular direction.

In the present embodiment, the ventilation hole 23 having a circular cross-section along the perpendicular direction is formed by the wall surface 25. The first slope surface section 25a is inclined such that a rate of change in the cross-sectional area is constant in the penetrating direction. In other words, the rate of change in the cross-sectional area of the first slope surface section 25a per unit distance in the penetrating direction of the ventilation hole 23 is generally constant along the entire extent of the first slope surface section 25a. That is, an inclined angle θ1 with respect to the perpendicular direction is constant. It is easy to form the first slope surface section 25a with the constant inclined angle θ1 by molding or a process after molding, compared with other slope surface sections (refer to the following modified examples).

In the penetrating direction, one end (outer end) of the first slope surface section 25a forms an outer opening end 25c, and the other end (inner end) of the first slope surface section 25a forms a connection 25d. The outer opening end 25c configures an outer-surface side open end of the ventilation hole 23, and the connection 25d is connected to the cylindrical surface section 25b. The first slope surface section 25a has a rotationally symmetrical structure with respect to a central axis 23c of the ventilation hole 23 having the circular cross-section. The outer opening end 25c and the connection 25d, which has a diameter along the perpendicular direction smaller than that of the outer opening end 25c, are arranged in a concentric pattern with respect to the central axis 23c. Here, the central axis 23c is generally parallel to the penetrating direction of the ventilation hole 23.

In the penetrating direction, one end (outer end) of the cylindrical surface section 25b forms the connection 25d, and the other end (inner end) of the cylindrical surface section 25b forms an inner opening end 25e. The inner opening end 25e configures an inner-surface side open end of the ventilation hole 23. In addition, in FIG. 5, t0 denotes a penetration length of the ventilation hole 23, that is, a thickness of a portion in the case 21, in which the ventilation hole 23 is formed. In other words, t0 denotes a thickness of the housing wall 21c measured in the penetrating direction. Moreover, t1 denotes a length of the cylindrical surface section 25b measured in the penetrating direction. In this manner, the cylindrical surface section 25b having the length of t1 in the penetrating direction and the first slope surface section 25a having a length of (t0-t1) in the penetrating direction are located in this order from a side of the inner surface 21b of the case 21.

The filter 24 is attached to the inner surface 21b of the case 21 so as to cover the ventilation hole 23, more specifically, so as to close the inner-surface side open end of the ventilation hole 23, i.e., the inner opening end 25e of the wall surface 25. Thus, a peripheral portion of the inner opening end 25e in the inner surface 21b of the waterproof housing 20 is a filter attachment portion 26 to which the filter 24 is attached.

In the present embodiment, as shown in FIG. 4, a shape of the filter 24 along the perpendicular direction is a circular shape. In FIGS. 4 and 5, the reference numeral 24a denotes an exposed portion of the filter 24, which is opposed to the ventilation hole 23, and the reference numeral 24b denotes an outer peripheral end of the filter 24 in the perpendicular direction. If the filter 24 is attached to the filter attachment portion 26 of the case 21 such that the center of the filter 24 corresponds to the central axis 23c of the ventilation hole 23, the outer peripheral end 24b of the filter 24, the outer opening end 25c and the connection 25d of the wall surface 25 are arranged in a concentric pattern.

As described above, in the present embodiment, the filter attachment portion 26 is arranged on the inner surface 21b of the case 21 configuring the waterproof housing 20, and the filter 24 is attached to the inner surface 21b of the case 21. Therefore, in washing the vehicle, the high-pressure water flow (e.g., water flow of about 8 to 10 MPa) of the vehicle washer is not directly poured onto a portion of the case 21, to which the filter 24 is attached (hereinafter referred to as an attachment part). Accordingly, the peel-off of the sheet-like filter 24 due to the high-pressure water flow can be suppressed compared with the configuration in which the filter 24 is attached to the outer surface 21a of the case 21 and the high-pressure water flow is directly poured on the attachment part.

In the case where the filter 24 is attached to the inner surface 21b of the case 21, it is difficult for the high-pressure water flow with a small incident angle $\alpha 1$ (refer to FIG. 6) with respect to the perpendicular direction to be directly poured on the exposed portion 24a of the filter 24 because of the thickness t0 of the case 21. In other words, it is easy for the high-pressure water flow with a large incident angle $\alpha 1$ to be directly poured on the exposed portion 24a of the filter 24.

Figure 6:
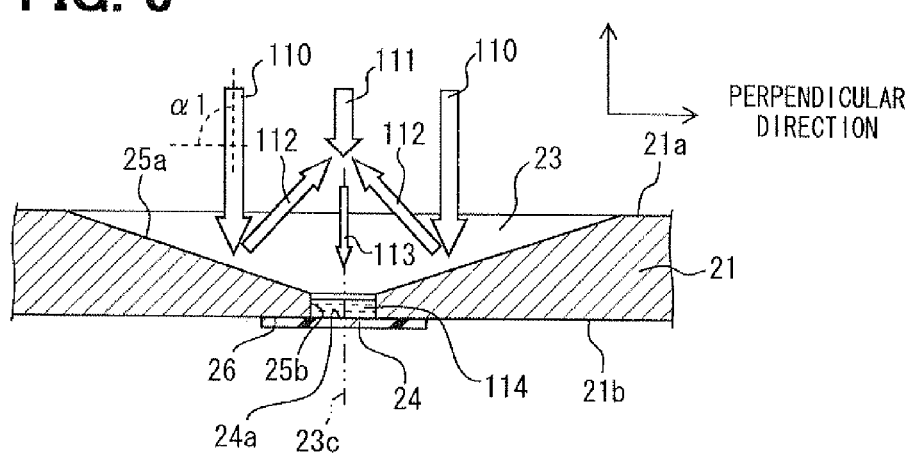
FIG. 6 is a cross-sectional view showing the effect of a wall surface and an installation structure of the filter shown in FIG. 5.

In contrast, in the present embodiment, the case 21 has the inclined first slope surface section 25a as the wall surface 25 of the ventilation hole 23. The first slope surface section 25a is formed such that the cross-sectional area thereof is increased with distance from the filter 24. For example, as shown in FIG. 6, if high-pressure water flows 110, 111 are injected toward the case 21 with a large incident angle $\alpha 1$ ($\alpha 1=90°$ in FIG. 6), a part of the high-pressure water flow 110 injected to the first slope surface section 25a is reflected on the first slope surface section 25a and a reflected water flow 112 hits against the high-pressure water flow 111 above (anterior to) the exposed portion 24a of the filter 24. Thus, an impetus of the high-pressure water flow 111 that is going to directly hit against the filter 24 is weakened to become a water flow 113 with a low pressure.

Specifically, in the present embodiment, the first slope surface section 25a has the constant inclined angle $\theta 1$ and the rotationally symmetrical structure with respect to the central axis 23c. Thus, compared with a first slope surface section 25a having a constant rate of change in the cross-sectional area thereof and an asymmetrical structure in the penetrating direction, the reflected water flow 112 which has reflected on the first slope surface section 25a concentrates in a narrow region in the penetrating direction. Therefore, the impetus of the high-pressure water flow 111 can be weakened effectively.

Furthermore, in the present embodiment, the filter 24 is attached to the filter attachment portion 26 arranged on the inner surface 21b of the case 21. Therefore, if the high-pressure water flows 110, 111 are injected, at the beginning of the injection, water 114 is stored in the ventilation hole 23 due to at least the impetuses of the high-pressure water flows 110, 111 with the exposed portion 24a of the filter 24 used as an end surface. Since the stored water 114 functions as a cushion, the high-pressure water flows 110, 111 (including the water flow 113) can be restrained from directly hitting against the exposed portion 24a of the filter 24 despite the incident angle $\alpha 1$, that is, even when the incident angle $\alpha 1$ of each of the high-pressure water flows 110, 111 is small.

Specifically, in the present embodiment, the wall surface 25 includes the cylindrical surface section 25b as a connecting surface section that connects the first slope surface section 25a with the inner opening end 25e. The first slope surface section 25a is located away from the inner-surface side open end of the ventilation hole 23. A smallest cross-sectional area of the cylindrical surface section 25b as the connecting surface section is located at the outer end of the cylindrical surface section 25b, which is directly connected to the inner end of the first slope surface section 25a at the connection 25d. The configuration of the present embodiment is compared with the configuration in which the one end of the first slope surface section 25a forms the inner opening end 25e of the wall surface 25. If the cross-sectional area of the ventilation hole 23 at the inner-surface side open end (in other words, the attaching structure of the filter 24 with respect to the case 21) and the amount of the water 114 stored in the ventilation hole 23 with the filter 24 used as the end surface are common in the two configurations, a depth of the water 114 stored in the ventilation hole 23 with the filter 24 used as the end surface can be increased in the configuration of the present embodiment. Thus, a cushioning effect can be improved, and the peel-off of the filter 24 can be restrained effectively.

As described above, in the waterproof housing 20 according to the present embodiment, that is, in the electronic control unit 100, the peel-off of the filter 24 due to the high-pressure water flows 110, 111 can be suppressed compared with the configuration according to the related art.

If the water 114 remains in the ventilation hole 23 with the filter 24 used as the end surface, the ventilation hole 23 is closed by the water 114, and thereby, a pressure inside the waterproof housing 20 becomes a negative pressure with respect to a pressure outside the housing 20. Thus, the water 114 may penetrate into the filter 24 or the water 114 may be drawn into the inside of the waterproof housing 20. Therefore, it is preferable that the waterproof housing 20, that is, the electronic control unit 100 is installed to the vehicle such that when the injection of the high-pressure water flows 110, 111 is stopped, the water 114 flows out of the wall surface 25 by its own weight with the electronic control unit 100 installed to a predetermined position of the vehicle.

Figure 7:
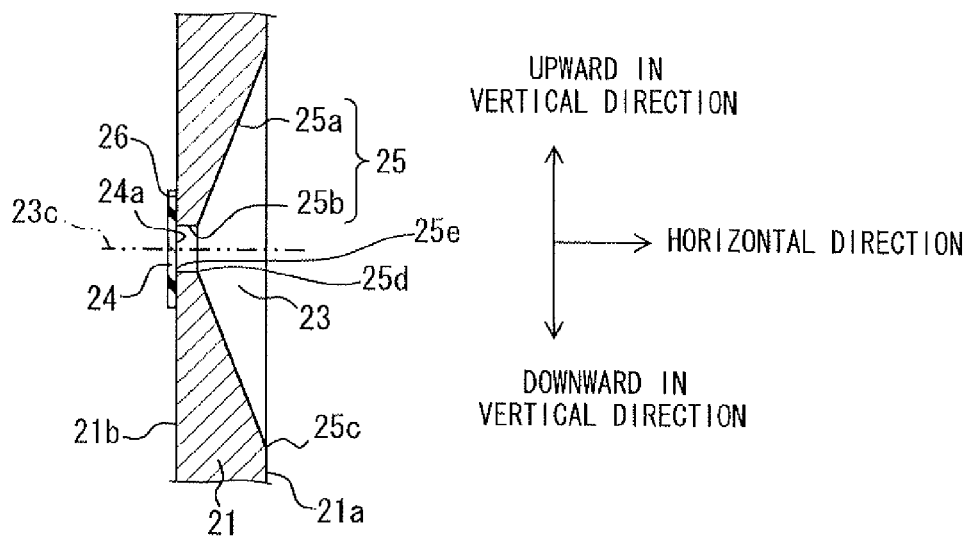
FIG. 7 is a cross-sectional view showing the arrangement of the ventilation hole and the filter with the electronic control unit installed to a vehicle.

In the case of the wall surface 25 of the present embodiment, for example, as shown in FIG. 7, the electronic control unit 100 may be installed to the vehicle such that the central axis 23c of the ventilation hole 23 extends along a horizontal direction. That is, the electronic control unit 100 may be installed to the vehicle such that the ventilation hole 23 covered by the filter 24 opens in the horizontal direction. According to such an installation structure, when the high-pressure water flows 110, 111 are injected, the water 114 is stored in the ventilation hole 23 (refer to FIG. 6) with the exposed portion 24a of the filter 24 used as the end surface, due to the impetus of the water flow. When the injection is stopped, the stored water 114 flows out of the wall surface 25 by its own weight. In addition, the horizontal direction is a direction perpendicular to a vertical direction.

In addition to the configuration shown in FIG. 7, for example, the electronic control unit 100 may be installed to the vehicle such that the outer-surface side open end of the ventilation hole 23 is located below the inner-surface side open end thereof with the central axis 23c extending along the vertical direction. That is, the electronic control unit 100 may be installed to the vehicle such that the ventilation hole 23 covered by the filter 24 opens downward in the vertical direction.

First Modified Example

Figure 8:
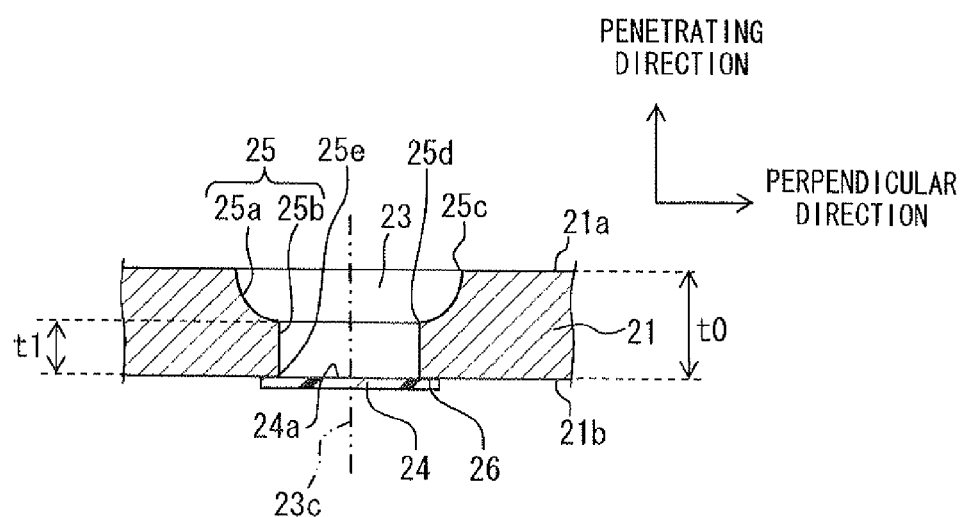
FIG. 8 is a cross-sectional view showing a modified example of a first slope surface section.

In the waterproof housing 20 shown in FIG. 8, that is, in the electronic control unit 100, the first slope surface section 25a formed in the case 21 has a slope which is formed such that a rate of change in the cross-sectional area thereof is increased toward the filter 24 in the penetrating direction. In other words, the first slope surface section 25a is configured such that a rate of change in the cross-sectional area thereof per unit distance in the penetrating direction of the ventilation hole 23 is increased toward the inner surface 21b of the housing wall 21c. The configurations other than the configuration of the first slope surface section 25a are the same as those shown in FIG. 5. In FIG. 8, the first slope surface section 25a is a sloping surface having a single radius of curvature.

In addition to the effect obtained by the configurations shown in FIG. 5, the following effect can be further obtained by adopting the above configuration.

Figure 9A:
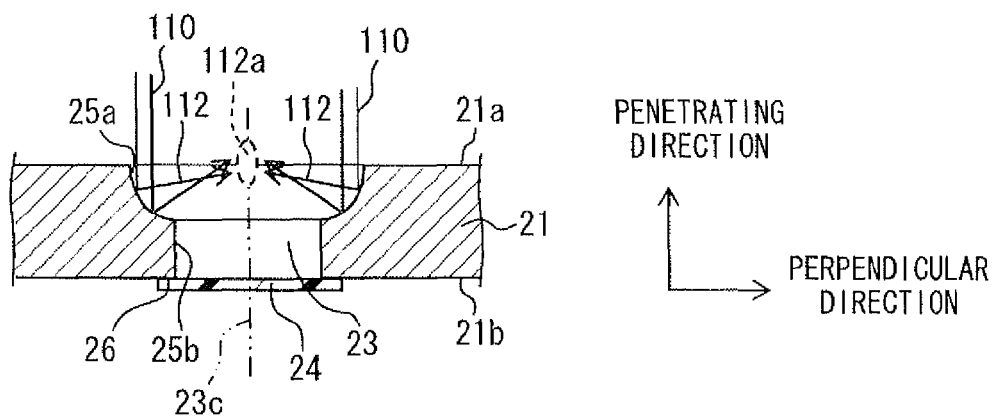
FIG. 9A is a cross-sectional view showing the effect of the first slope surface section shown in FIG. 8.
Figure 9B:
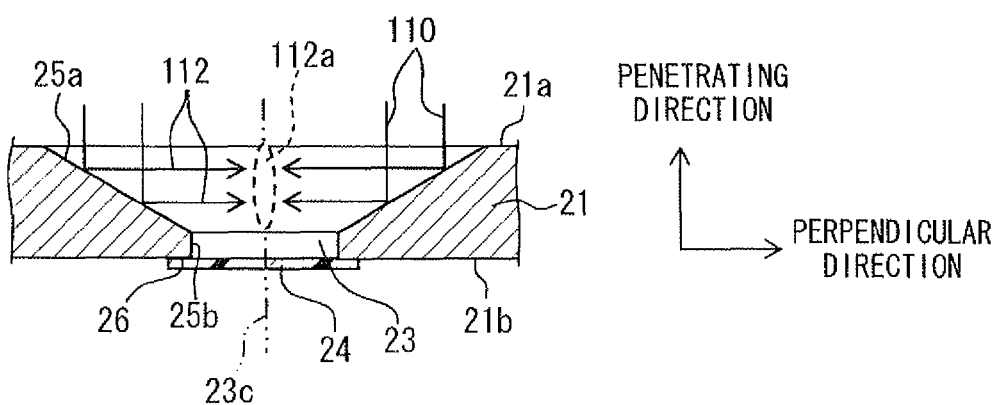
FIG. 9B is a cross-sectional view showing the effect of the first slope surface section shown in FIG. 5 as a comparative example.

As shown in FIG. 9A, the high-pressure water 110 with a large incident angle α1 (α1=90° in FIG. 9A) is reflected on the first slope surface section 25a and the reflected water flow 112 concentrates in a region 112a above (anterior to) the exposed portion 24a of the filter 24. By using the first slope surface section 25a shown in FIG. 8, the region 112a in the penetrating direction can be narrowed compared with the region 112a shown in FIG. 9B, in which the first slope surface section 25a shown in FIG. 5 is used.

Thus, the impetus of the high-pressure water flow 111 (not shown in FIG. 9A) that is going to directly hit against the exposed portion 24a of the filter 24 can be effectively weakened by the water flow 112.

Specifically, as well as the configuration shown in FIG. 5, in the configuration shown in FIG. 8, the first slope surface section 25a has the rotationally symmetrical structure with respect to the central axis 23c of the ventilation hole 23 having the circular cross-section. Therefore, compared with the configuration, in which the first slope surface section 25a has a slope formed such that a rate of change in the cross-sectional area thereof is increased toward the filter 24 in the penetrating direction and does not have a single radius of curvature, the water flow 112 which has reflected on the first slope surface section 25a can concentrate in a narrower region in the penetrating direction.

Second Modified Example

Figure 10:
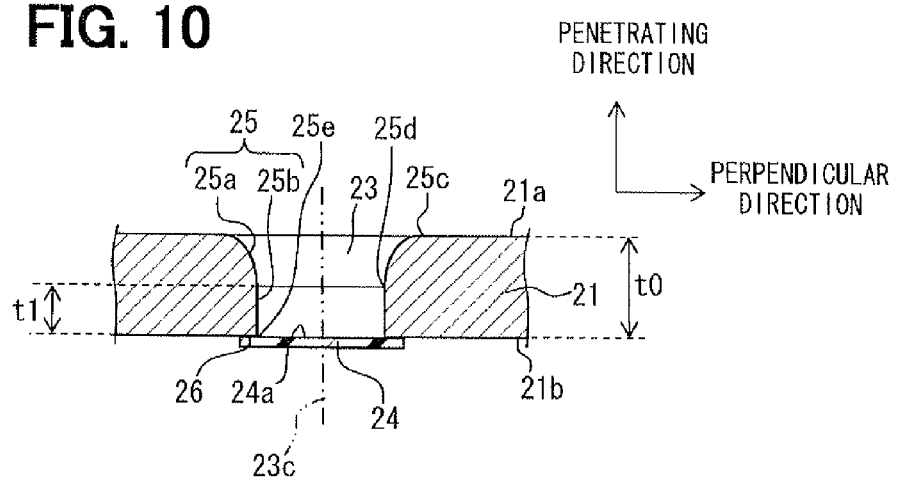
FIG. 10 is a cross-sectional view showing another modified example of the first slope surface section.

In the waterproof housing 20 shown in FIG. 10, that is, in the electronic control unit 100, the first slope surface section 25a formed in the case 21 has a slope which is formed such that a rate of change in the cross-sectional area thereof is decreased toward the filter 24 in the penetrating direction. In other words, the first slope surface section 25a is configured such that a rate of change in the cross-sectional area thereof per unit distance in the penetrating direction of the ventilation hole 23 is decreased toward the inner surface 21b of the housing wall 21c. The configurations other than the configuration of the first slope surface section 25a are the same as those shown in FIG. 5. In FIG. 10, the first slope surface section 25a is a sloping surface having a single radius of curvature.

In addition to the effect obtained by the configurations shown in FIG. 5, the following effect can be further obtained by adopting the above configuration.

Figure 11:
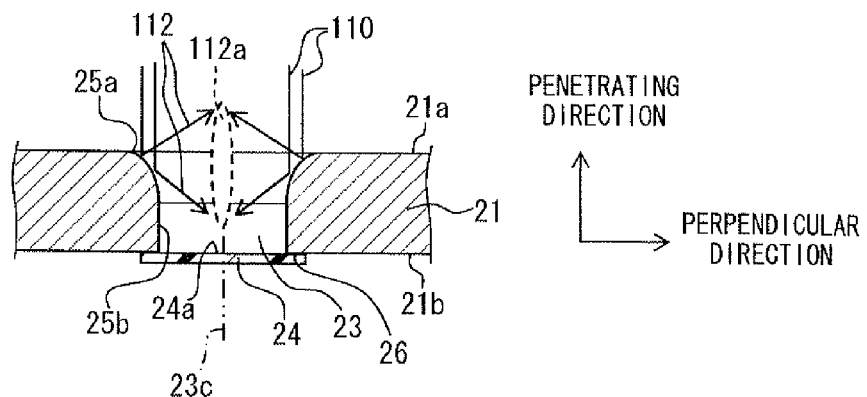
FIG. 11 is a cross-sectional view showing the effect of the first slope surface section shown in FIG. 10.

As shown in FIG. 11, the high-pressure water 110 with a large incident angle α1 (α1=90° in FIG. 11) is reflected on the first slope surface section 25a and the reflected water flow 112 concentrates in the region 112a above (anterior to) the exposed portion 24a of the filter 24. By using the first slope surface section 25a shown in FIG. 10, the region 112a in the penetrating direction can be broadened compared with the region 112a shown in FIG. 9B, in which the first slope surface section 25a shown in FIG. 5 is used.

Figure 12:
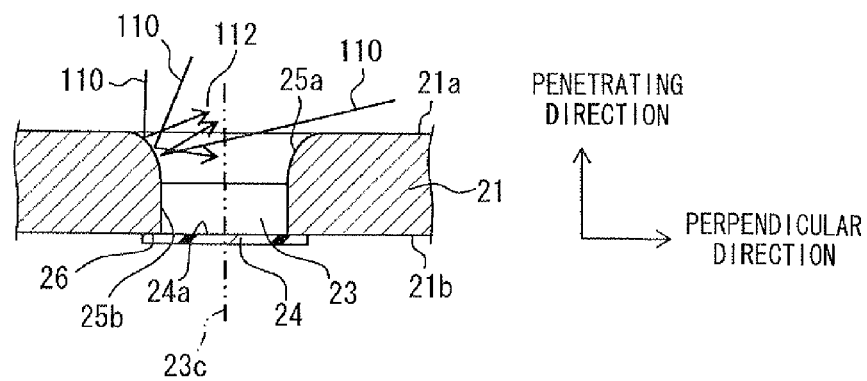
FIG. 12 is a cross-sectional view showing the effect of the first slope surface section shown in FIG. 10.

In other words, as shown in FIG. 12, with respect to the high-pressure water flows 110 with various incident angles α1, the reflected water flow 112 can move toward the upper side of the exposed portion 24a of the filter 24, compared with the first slope surface section 25a shown in FIG. 5 and the first slope surface section 25a shown in FIG. 8. In this manner, the range of the incident angle α1 of the first slope surface section 25a shown in FIG. 10 is broader than those of the first slope surface section 25a shown in FIG. 5 and the first slope surface section 25a shown in FIG. 8.

Therefore, the configuration shown in FIG. 10 has a higher degree of freedom for installation (arrangement) of the electronic control unit 100 to the vehicle, for example, than the configurations shown in FIGS. 5 and 8.

Third Modified Example

Figure 13:
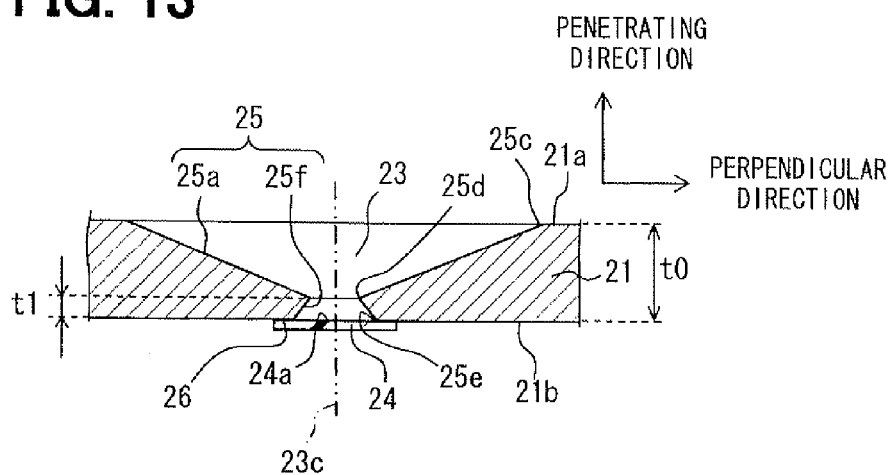
FIG. 13 is a cross-sectional view showing a modified example of a connecting surface section.
Figure 14:
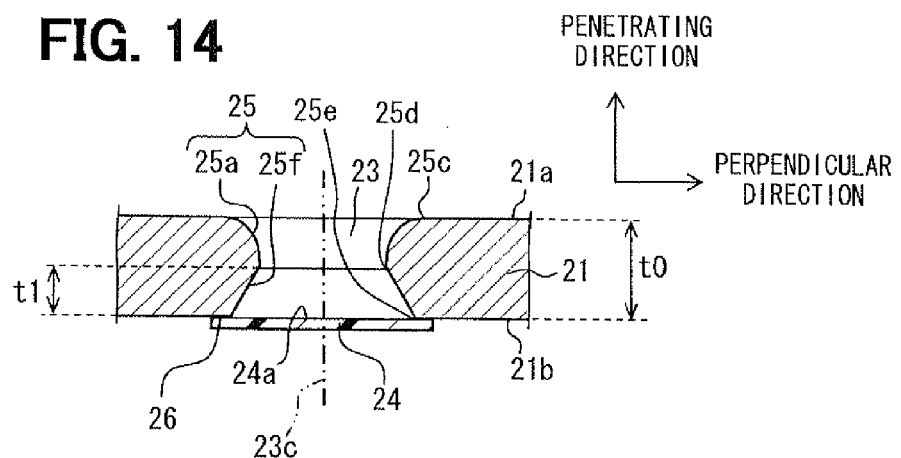
FIG. 14 is a cross-sectional view showing the modified example of the connecting surface section.
Figure 15:
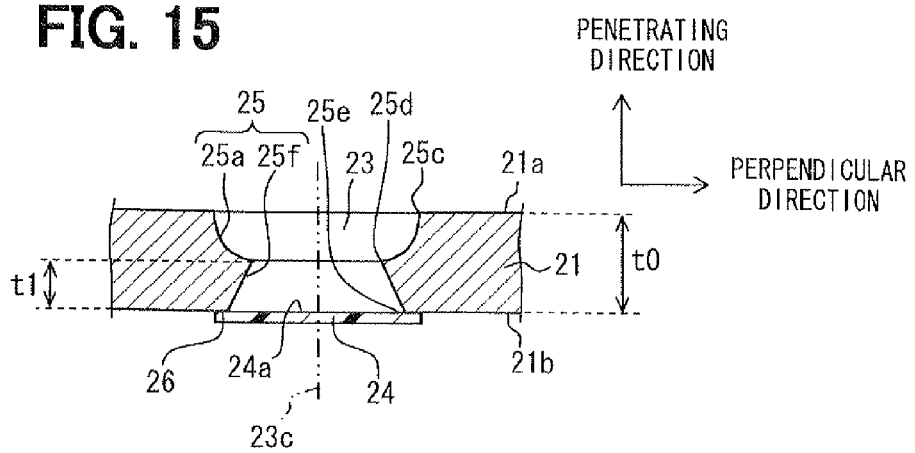
FIG. 15 is a cross-sectional view showing the modified example of the connecting surface section.

In the waterproof housing 20 shown in FIGS. 13 to 15, that is, in the electronic control unit 100, the wall surface 25 includes a second slope surface section 25f as the connecting surface section that connects the first slope surface section 25a with the inner opening end 25e. The second slope surface section 25f is formed such that the cross-sectional area thereof is increased toward the inner surface 21b (filter 24) in the penetrating direction. That is, the second slope surface section 25f has an increasing cross-sectional area that progressively increases toward the inner surface 21b of the housing wall 21c in the penetrating direction of the ventilation hole 23. FIG. 13 corresponds to FIG. 5 to which the second slope surface section 25f is applied, FIG. 14 corresponds to FIG. 10 to which the second slope surface section 25f is applied, and FIG. 15 corresponds to FIG. 8 to which the second slope surface section 25f is applied.

In addition to the effect obtained by the configurations shown in FIGS. 5, 8 and 10, the following effect can be further obtained by adopting the above configuration.

By adopting the above configuration, the cross-sectional area of the connection 25d between the first slope surface section 25a and the second slope surface section 25f as the connecting surface section can be made smaller than the cross-sectional area of the inner opening end 25e. A smallest cross-sectional area of the second slope surface section 25f as the connecting surface section is located at the outer end of the second slope surface section 25f, which is directly connected to the inner end of the first slope surface section 25a at the connection 25d. The above configuration is compared with the configuration in which the cylindrical surface section 25b is used as the connecting surface section. If the diameter of the exposed portion 24a of the filter 24, which is exposed through the ventilation hole 23 having the circular cross-section, is common in the two configurations, in other words, the attaching structure of the filter 24 with respect to the filter attachment portion 26 is common in the two configurations, it is more difficult for the high-pressure water flow 111 (water flow 113) to be directly poured on the filter 24 in the above configuration.

Furthermore, a depth of the water 114 stored in the ventilation hole 23 with the filter 24 used as the end surface can be increased. Therefore, the cushioning effect by the water 114 can be further improved in the above configuration.

(Test Results)

Next, results of a peel test of the filter will be described. In the peel test, the inventor formed samples having the configurations shown in FIGS. 5, 8, 10, 13 and 15 and injected the high-pressure water flow with respect to each sample.

In the peel test, the thickness t0 of the case 21 was set to be 1.4 mm, a diameter D3 of the exposed portion 24a of the filter 24, which is exposed through the ventilation hole 23 having the circular cross-section, was set to be 4 mm in each sample.

Each of the samples A1 to A6 has the configuration shown in FIG. 5, in which the inclined angle θ1 is constant and the cylindrical surface section 25b is used as the connecting surface section. Each of the samples A7 and A8 has the configuration shown in FIG. 13, in which the inclined angle θ1 is constant and the second slope surface section 25f is used as the connecting surface section. In addition, in FIG. 17, the configuration in which the cylindrical surface section 25b is used as the connecting surface section is shown as an example of the sample having the constant inclined angle θ1. However, the regulation of a dimension or an angle is common to both the configuration in which the cylindrical surface section 25b is used as the connecting surface section and the configuration in which the second slope surface section 25f is used as the connecting surface section.

In the samples A1 to A3, the lengths t1 of the cylindrical surface section 25b are set to be 0.5 mm and the inclined angles θ1 are set to be 10°, 20°, 30°, respectively. In the samples A4 to A6, the lengths t1 of the cylindrical surface section 25b are set to be 1.0 mm and the inclined angles θ1 are set to be 10°, 20°, 30° respectively. In the sample A7, the inclined angle θ1 is set to be 10° and the length t1 of the second slope surface section 25f is set to be 0.5 mm. In the sample A8, the inclined angle θ1 is set to be 10° and the length t1 of the second slope surface section 25f is set to be 1.0 mm. Here, the length t1 of the second slope surface section 25f is a length of the second slope surface section 25f measured in the penetrating direction.

Figures 16, 17:
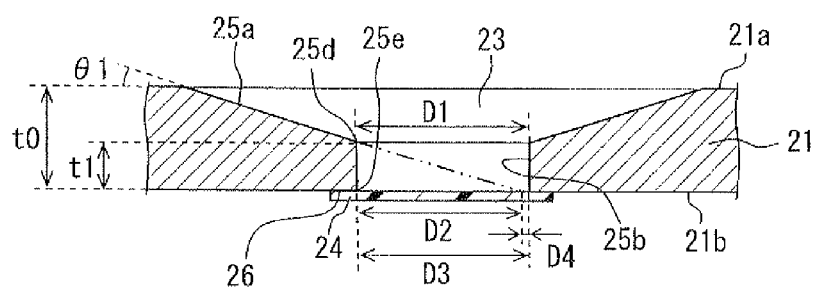
FIG. 16 is a table showing details of samples A1 to A8 in samples used for a peel test of the filter.
FIG. 17 is a representative view showing the details of the samples A1 to A8.

A diameter (inner diameter) of the connection 25d between the outer end of the connecting surface section (the cylindrical surface section 25b or the second slope surface section 25f) and the inner end of the first slope surface section 25a is denoted by D1. As shown in FIG. 16, in the samples A1 to A6, in which the cylindrical surface section 25b is used as the connecting surface section, the diameter D1 was set to be 4 mm that is the same as the diameter D3. In contrast, in the samples A7 and A8, in which the second slope surface section 25f is used as the connecting surface section, the diameter D1 was set to be 2.5 mm that is smaller than the diameter D3.

D2 denotes a distance, which is measured in the perpendicular direction between: a cross-point where an imaginary extension line (two-dot chain line in FIG. 17), which extends along and projects from the first slope surface section 25a, intersects with a plane of the inner surface 21b of the housing wall 21c; and a projecting point of the imaginary extension line, at which the imaginary extension line projects from the connection 25d between the outer end of the connecting surface section (the cylindrical surface section 25b or the second slope surface section 25f) and the inner end of the slope surface section 25a. The distance D2 can be expressed by the following equation. The imaginary extension line of the first slope surface section 25a is a tangent line of the first slope surface section 25a.

$$D2 = \{t1^2/(1-\cos^2\theta 1)\}^{1/2} \times \cos\theta 1 \quad \text{(equation 1)}$$

The distance D2 of each of the samples A1 to A8 shown in FIG. 16 is a result calculated from the equation 1. As shown in FIG. 16, in each of the samples A1, A4, A5, A7 and A8, the distance D2 satisfies a relationship of the following equation.

$$D2 > \tfrac{1}{2} \times D1 \quad \text{(equation 2)}$$

Furthermore, in the sample A4, the distance D2 satisfies a relationship of the following equation.

$$D2 > D1 \quad \text{(equation 3)}$$

That is, as shown in FIG. 16, the sample A4 is formed such that the imaginary extension line of the first slope surface section 25a intersects with a wall surface of a corresponding connecting surface section (i.e., the cylindrical surface section 25b).

In addition, since the diameter D3 of the exposed portion 24a of the filter 24 is 4 mm, as shown in FIG. 16, the sample A8 is also formed such that the imaginary extension line of the first slope surface section 25a intersects with a wall surface of a corresponding connecting surface section (i.e., the second slope surface section 25f).

Each of the samples A1 to A3 and A5 to A7 shown in FIG. 16 is formed such that the imaginary extension line of the first slope surface section 25a intersects with the plane of the inner surface 21b of the housing wall 21c in the inner opening end 25e of the ventilation hole 23, that is, the imaginary extension line of the first slope surface section 25a does not intersect with the corresponding connecting surface section. In the samples A1 to A3 and A5 to A7, a minimum distance between the cross-point where the imaginary extension line of the first slope surface section 25a intersects with the plane of the inner surface 21b of the housing wall 21c and the inner opening end 25e of the ventilation hole 23 is denoted by D4 (refer to FIG. 17). As shown in FIG. 16, in the samples A1 to A3 and A5 to A7, the minimum distance D4 is set to be 1 mm or more in the samples A1, A2, A5 and A6, and the minimum distance D4 is set to be less than 1 mm in the samples A3 and A7. Specifically, the minimum distance D4 is less than 0.5 mm in the sample A7.

As shown in FIG. 10, a sample B has the first slope surface section 25a formed such that a rate of change in the cross-sectional area thereof is decreased toward the filter 24 in the penetrating direction, and the cylindrical surface section 25b as the connecting surface section. In the sample B, as shown in FIG. 18, the radius of curvature R of the first slope surface section 25a (i.e., first slope portion in FIG. 18) was set to be 0.7, and the length t1 of the cylindrical surface section 25b was set to be 0.7 mm.

As shown in FIG. 8, a sample C1 has the first slope surface section 25a formed such that a rate of change in the cross-sectional area thereof is increased toward the filter 24 in the penetrating direction, and the cylindrical surface section 25b as the connecting surface section. As shown in FIG. 15, each of samples C2 and C3 has the first slope surface section 25a formed such that a rate of change in the cross-sectional area thereof is increased toward the filter 24 in the penetrating direction, and the second slope surface section 25f as the connecting surface section. In the sample C1, as shown in FIG. 18, the radius of curvature R was set to be 0.7, and the length t1 of the cylindrical surface section 25b was set to be 0.7 mm. As shown in FIG. 18, in the sample C2, the radius of curvature R was set to be 0.9, and the length t1 of the second slope surface section 25f was set to be 0.5 mm. In the sample C3, the radius of curvature R was set to be 0.4, and the length t1 of the second slope surface section 25f was set to be 1.0 mm. Furthermore, in the samples C2 and C3 having the second slope surface section 25f, the diameter D1 of the connection 25d between the second slope surface section 25f and the first slope surface section 25a was set to be 2.5 mm.

Moreover, as a comparative object of the samples A1 to A8, B and C1 to C3, a sample which has a ventilation hole having a circular cross-section with the constant diameter D3 at any position in the penetrating direction, in which the thickness t0 is 1.4 mm and the diameter D3 is 4 mm, was prepared.

In the above-described samples A1 to A8, B, C1 to C3 and the comparative sample, the filter 24 was attached to the filter attachment portion 26 on the inner surface 21b of the case 21 with adhesive tape having a circular shape with an inner diameter of 8.89 mm and an outer diameter of 19.05 mm. That is, the area of the filter attachment portion 26 (attachment area of the filter 24) was set to be 222.95 mm².

The pressure of the high-pressure water flow was set to be 8 MPa. The incident angle α1 was set to be 90°, that is, the high-pressure water flow was injected to each sample in the penetrating direction of the ventilation hole 23, and a peeled area of each sample was measured. In each sample, three samples were prepared. Each of values shown in FIG. 19 is an average value of the three samples in each sample.

First, the samples A1 to A8 having the constant inclined angle θ1 will be considered.

As shown in FIG. 19, it became clear from the comparison between the samples A1 to A3 having the common length t1 and the comparison between the samples A4 to A6 having the common length t1, that the peeled area becomes small as the inclined angle θ1 is decreased.

It is considered that this is because 1) it becomes difficult for the high-pressure water flow 110 which is not reflected on the first slope surface section 25a and flows along the first slope surface section 25a to be poured on the exposed portion 24a of the filter 24, and 2) the impetus of the high-pressure water flow 111 can be weakened due to the water flow 112 (refer to FIG. 6) which has reflected on the first slope surface section 25a because the area of the first slope surface section 25a is increased as the inclined angle θ1 is decreased.

Furthermore, it became clear from the comparison between the samples A1 and A4 having the common inclined angle θ1, the comparison between the samples A2 and A5 having the common inclined angle θ1, and the comparison between the samples A3 and A6 having the common inclined angle θ1, that the peeled area becomes small as the length t1 of the cylindrical surface section 25b is increased. Similarly, it became clear from the comparison between the samples A7 and A8 having the common inclined angle θ1, that the peeled area becomes small as the length t1 of the second slope surface section 25f is increased.

It is considered that this is because 1) if the water 114 stored in the ventilation hole 23 with the filter 24 used as the end surface is a constant amount, the depth of the water 114 can be increased as the length t1 of the connecting surface section (the cylindrical surface section 25b or the second slope surface section 25f) is increased and the cushioning effect can be improved, and 2) it becomes difficult for the water flow flowing along the first slope surface section 25a to be directly poured on the exposed portion 24a of the filter 24 attached to the filter attachment portion 26 on the inner surface 21b of the case 21 as the length t1 of the connecting surface section is increased.

In the samples A4 to A6 and A8, in which the peeled area is small, the length t1 of the connecting surface section (the cylindrical surface section 25b or the second slope surface section 25f) is 1.0 mm. In the samples A1 to A3 and A7, the length t1 is 0.5 mm.

Accordingly, it is clear that if the length t1 of the connecting surface section (the cylindrical surface section 25b or the second slope surface section 25f) is equal to or larger than one-half of the thickness t0 of the waterproof housing 20 (the case 21), the peel-off of the sheet-like filter 24 due to the high-pressure water flow can be suppressed compared with the configuration where t1<(t0/2).

In the samples A1, A4, A5 and A8 of five samples A1, A4, A5, A7 and A8, which satisfy the relationship of the above equation 2, it became clear that the peeled area becomes drastically small compared with the comparative sample.

It is considered that this is because 1) the water flows which are not reflected on the surface of the first slope surface section 25a and flow along the first slope surface section 25a formed to surround the exposed portion 24a of the filter 24 hit against each other and the impetuses of the water flows are weakened before the water flows are poured on the filter 24, and 2) the impetus of the high-pressure water flow 111 (the water flow 113) that is going to directly hit against the filter 24 is weakened due to the water flow flowing along the first slope surface section 25a.

Especially, in the samples A4 and A8 configured such that the imaginary extension line of the first slope surface section 25a intersects with the wall surface of the corresponding connecting surface section, it became clear that the peeled area becomes drastically small compared with the comparative sample.

It is considered that this is because the water flow flowing along the first slope surface section 25a of the high-pressure water flow 110 hits against the wall surface of the connecting surface section (the cylindrical surface section 25b or the second slope surface section 25f) before the water flow is poured on the filter 24 and the impetus of the water flow is further weakened before the water flow is poured on the filter 24.

Moreover, although the inclined angle θ1 of 10° is common in the samples A4 and A8, the peeled area of the filter 24 in the sample A8 having the second slope surface section 25f is smaller than that in the sample A4 having the cylindrical surface section 25b.

It is considered that this is because 1) the cross-sectional area of the connection 25d between the first slope surface section 25a and the connecting surface section is smaller than the cross-sectional area of the inner opening end 25e of the ventilation hole 23 and the high-pressure water flow 111 (the water flow 113) which directly hits against the filter 24 is reduced, and 2) the depth of the water 114 stored in the ventilation hole 23 with the filter 24 used as the end surface can be increased and the cushioning effect can be further improved.

In contrast, although the inclined angle θ1 of 10° is common in the samples A4 and A7, the peeled area of the filter 24 in the sample A7 having the second slope surface section 25f is larger than that in the sample A4 having the cylindrical surface section 25b and is substantially the same as that in the comparative sample.

As shown in FIG. 16, in the sample A7, the minimum distance D4 between the cross-point where the imaginary extension line of the first slope surface section 25a intersects with the plane of the inner surface 21b of the housing wall 21c and the inner opening end 25e of the ventilation hole 23 is 0.41 mm. Thus, the water flow flowing along the first slope surface section 25a is directly poured in the vicinity of the attachment part (the filter attachment portion 26 of the case 21) in the exposed portion 24a of the filter 24. It is considered that as a result, the effect obtained by using the second slope surface section 25f is canceled, and the peeled area of the filter 24 in the sample A7 becomes larger than that in the sample A4.

It is clear from the result of the sample A3 having the minimum distance D4 of 0.87 mm as shown in FIG. 16, that the water flow flowing along the first slope surface section 25a is poured in the vicinity of the attachment part (the filter attachment portion 26 of the case 21) in the exposed portion 24a of the filter 24 so that the peeled area is increased.

Accordingly, it is preferable that the above-described minimum distance D4 is 1 mm or more in the configuration in which the imaginary extension line of the first slope surface section 25a intersects with the plane of the inner surface 21b of the housing wall 21c in the inner opening end 25e of the ventilation hole 23. By adopting such a configuration, the water flow flowing along the first slope surface section 25a is poured on a part separately from the attachment part of the filter 24. Thus, the peel-off of the sheet-like filter 24 due to the high-pressure water flow 110 can be suppressed.

Based on the above results, as shown in FIGS. 5 and 13, in the configuration in which the penetrating direction of the ventilation hole 23 having the circular cross-section is perpendicular to the inner surface 21b and the outer surface 21a of the case 21, and the wall surface 25 includes the first slope surface section 25a with the constant inclined angle θ1 and the connecting surface section (the cylindrical surface section 25b or the second slope surface section 25f) and has rotational symmetry about the central axis 23c of the ventilation hole 23, it is preferable that the wall surface 25 is formed to satisfy the relationship of the equation 2. It is most preferable that the wall surface 25 is formed such that the imaginary extension line of the first slope surface section 25a intersects with the wall surface of the connecting surface section (the cylindrical surface section 25b or the second slope surface section 25f).

Moreover, it is preferable that the length t1 of the connecting surface section is equal to or larger than one-half of the thickness t0 of the case 21. Furthermore, it is preferable that the wall surface 25 is formed such that the minimum distance D4 between the cross-point where the imaginary extension line of the first slope surface section 25a intersects with the plane of the inner surface 21b of the housing wall 21c and the inner opening end 25e of the ventilation hole 23 becomes 1 mm or more.

In contrast, it is clear from the comparison with the comparative sample shown in FIG. 19, that the peeled area in the sample B can be decreased compared with the related art.

In addition, it is clear from the comparison with the comparative sample shown in FIG. 19, that the peeled area in each of the samples C1 to C3 can be decreased compared with the related art.

It is clear from the comparison between the samples B and C1 having the cylindrical surface section 25b and the common thickness t1, that the sample C1 having the first slope surface section 25a that is formed such that a rate of change in the cross-sectional area thereof is increased toward the filter 24 in the penetrating direction is effective for suppressing the peel-off of the filter 24 with respect to the high-pressure water flow with a large incident angle α1, compared with the sample B.

Furthermore, it is clear from the comparison between the samples C1 to C3, that the configuration in which the second slope surface section 25f is used as the connecting surface section is effective for suppressing the peel-off of the sheet-like filter 24 due to the high-pressure water flow 110, compared with the configuration in which the cylindrical surface section 25b is used as the connecting surface section.

Furthermore, it is clear from the comparison between the samples C2 and C3, that the configuration in which the length t1 of the connecting surface section is equal to or larger than one-half of the thickness t0 of the case 21 is more effective for suppressing the peel-off of the filter 24.

In the samples C1 to C3, the first slope surface section 25a is formed such that a rate of change in the cross-sectional area thereof is increased toward the filter 24 in the penetrating direction. Thus, it becomes difficult for the water flow flowing along the first slope surface section 25a to be directly poured on the exposed portion 24a of the filter 24.

Hereinbefore, the preferred embodiment of the present invention is described. However, the present invention is not limited to the above-described embodiment, and various changes can be made without departing from the scope of the invention.

The present embodiment shows the example of the waterproof housing 20 used for the engine ECU for a vehicle as the waterproof housing, and the example of the electronic control unit 100 having a waterproof structure used for the engine ECU for a vehicle as the waterproof device. Moreover, the circuit board 10 is shown as an example of the electronic device 12 housed in the waterproof housing 20. However, the electronic device 12 is not limited to the circuit board 10, and the use of the waterproof housing 20 or the waterproof structure is not limited to the above-described example. For example, the waterproof housing 20 described in the present embodiment may be applied to a cover configuring a headlight of a vehicle. In this case, a lamp or the like corresponds to the electronic device 12.

In the present embodiment, the wall surface 25 of the waterproof housing 20 (the case 21) includes the cylindrical surface section 25b or the second slope surface section 25f as the connecting surface section. However, as shown in FIG. 20, the configuration in which the cylindrical surface section 25b and the second slope surface section 25f are used as the connecting surface section may be applied. In such a configuration, it is preferable that the wall surface 25 is formed to satisfy the relationship of the equation 2. It is most preferable that the wall surface 25 is formed such that the imaginary extension line of the first slope surface section 25a intersects with the wall surface of the connecting surface section (the cylindrical surface section 25b and the second slope surface section 25f). Moreover, it is preferable that the length t1 of the connecting surface section is equal to or larger than one-half of the thickness t0 of the case 21. Furthermore, it is preferable that the wall surface 25 is formed such that the minimum distance D4 between the cross-point where the imaginary extension line of the first slope surface section 25a intersects with the plane of the inner surface 21b of the housing wall 21c and the inner opening end 25e of the ventilation hole 23 becomes 1 mm or more.

Figure 21:
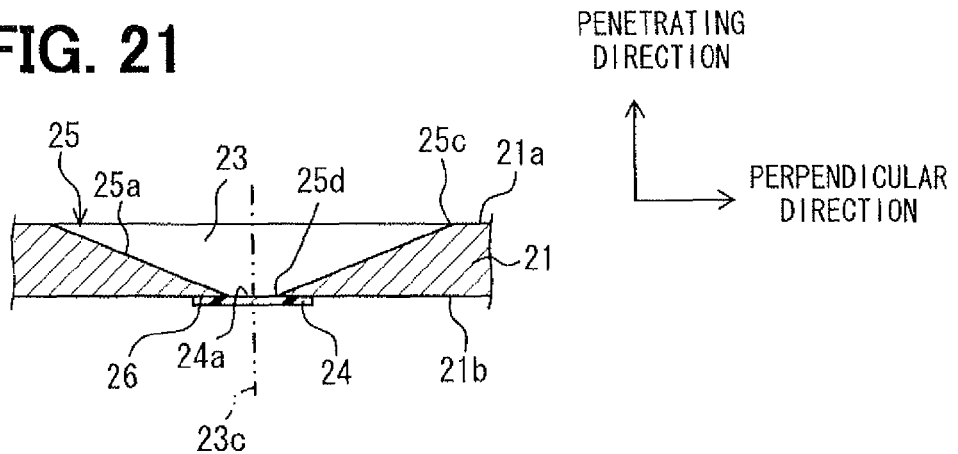
FIG. 21 is a cross-sectional view showing a modified example of the wall surface.

The configuration in which the wall surface 25 does not have the connecting surface section may be applied. In an example shown in FIG. 21, the wall surface 25 has only the first slope surface section 25a (the configuration shown in FIG. 5 is illustrated in FIG. 21 as an example). However, by forming the connecting surface section such as the cylindrical surface section 25b or the second slope surface section 25f, the cushioning effect of the stored water 114 with the filter 24 used as the end surface can be improved as described above.

In the present embodiment, the filter attachment portion 26 to which the filter 24 is attached is arranged on the inner surface 21b. However, as long as the ventilation hole 23 is covered by the filter 24, the configuration in which the filter attachment portion 26 is arranged at a position nearer the inner surface 21b than the first slope surface section 25a and the filter 24 is attached to the filter attachment portion 26 may be applied. For example, as shown in FIG. 22, the configuration in which the wall surface 25 includes the filter attachment portion 26 having an attachment surface perpendicular to the penetrating direction between the first slope surface section 25a and the inner opening end 25e may be applied.

Figure 22:
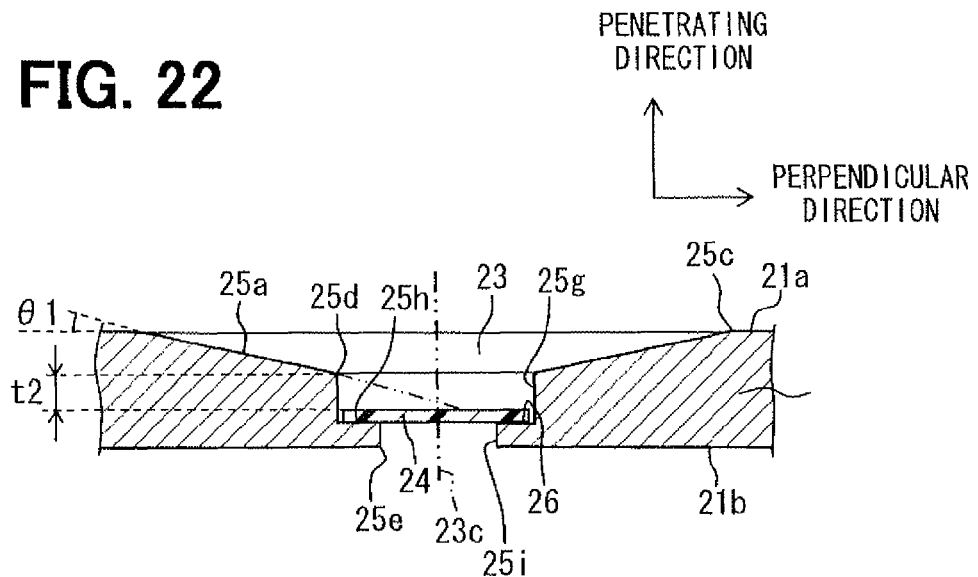
FIG. 22 is a cross-sectional view showing another modified example of an attachment position of the filter.

In the example shown in FIG. 22, the wall surface 25 includes the first slope surface section 25a, a first cylindrical surface section 25g, a perpendicular section 25h and a second cylindrical surface section 25i, which are arranged in this order from a side of the outer opening end 25c. One end of the first cylindrical surface section 25g is connected to the first slope surface section 25a. The first cylindrical surface section 25g is a portion with a constant cross-sectional area in the penetrating direction. The perpendicular section 25h protrudes toward the central axis 23c of the ventilation hole 23 from the first cylindrical surface section 25g, and has a surface perpendicular to the penetrating direction. A part of the perpendicular section 25h is used as the filter attachment portion 26. The second cylindrical surface section 25i is a portion with a constant cross-sectional area in the penetrating direction, and connects the perpendicular section 25h with the inner opening end 25e.

In the example shown in FIG. 22, a length of the first cylindrical surface section 25g is larger than a thickness of the filter 24 in the penetrating direction. That is, a length t2 from a surface (outer-surface side) of the filter 24 to the connection 25d has a predetermined length with the filter 24 attached to the filter attachment portion 26. If the length t1 in the above configuration in which the filter 24 is attached to the filter attachment portion 26 on the inner surface 21b is replaced with the length t2, and the plane with which the imaginary extension line of the first slope surface section 25a intersects is considered to be the same position as the surface (outer-surface side) of the filter 24 in the penetrating direction, the configuration is similar to the configuration (FIG. 5) described in the present embodiment. Therefore, if the preferred embodiment in the configuration shown in FIG. 5 is applied to FIG. 22, the effect corresponding to the effect obtained by the configuration shown in FIG. 5 can be obtained.

Figure 23:
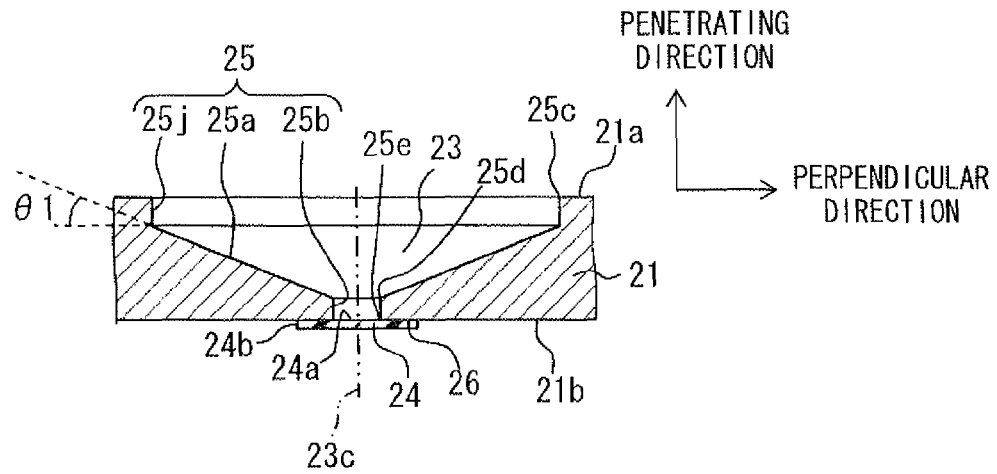
FIG. 23 is a cross-sectional view showing another modified example of the wall surface.

In the present embodiment, the first slope surface section 25a configures the outer opening end 25c in the wall surface 25. However, as shown in FIG. 23, for example, the configuration in which the wall surface 25 includes a cylindrical surface section 25j that connects the outer opening end 25c with the first slope surface section 25a may be applied. The cylindrical surface section 25j is a portion having a cross-sectional area that is the same as the cross-sectional area of the outer-surface side end portion of the first slope surface section 25a and extending in the penetrating direction.

Although the wall surface 25 has the rotational symmetry about the central axis 23c of the ventilation hole 23 in the present embodiment, the wall surface 25 may have non-rotational symmetry about the central axis 23c of the ventilation hole 23. However, as described above, it is preferable that the wall surface 25 has the rotational symmetry.

Although the cross-sectional shape of the ventilation hole 23 is the circular shape in the present embodiment, the cross-sectional shape is not limited to the circular shape. The cross-sectional shape of the ventilation hole 23 may be a polygonal shape such as a rectangular shape.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. An electronic apparatus for a vehicle, comprising:
at least one electronic device;
a waterproof housing that receives the at least one electronic device in an interior of the waterproof housing, wherein a ventilation hole penetrates through a housing wall of the waterproof housing from an inner surface to an outer surface of the housing wall in a penetrating direction thereof to communicate between an outside and an inside of the waterproof housing; and
a filter that is generally planar and is attached to a filter attachment portion of the housing wall to cover the ventilation hole, wherein:
a wall surface of the ventilation hole includes a slope surface section that has an increasing cross-sectional area, which progressively increases from an inner end to an outer end of the slope surface section toward the outer surface of the housing wall in the penetrating direction of the ventilation hole;
a distance between the filter attachment portion and the outer surface of the housing wall measured in the penetrating direction of the ventilation hole is larger than a distance between the inner end of the slope surface section and the outer surface of the housing wall measured in the penetrating direction of the ventilation hole; and
the slope surface section is configured such that a rate of change in the cross-sectional area of the slope surface section per unit distance in the penetrating direction of the ventilation hole is increased toward the inner surface of the housing wall.

2. The electronic apparatus according to claim 1, wherein:
the filter attachment portion is located in the inner surface of the housing wall around an inner opening end of the ventilation hole, which opens in the inner surface of the housing wall.

3. The electronic apparatus according to claim 2, wherein:
the wall surface of the ventilation hole further includes a connecting surface section that has an outer end, which is directly connected to the inner end of the slope surface section at a connection, and an inner end, which forms the inner opening end of the ventilation hole; and
a smallest cross-sectional area of the connecting surface section is located at the outer end of the connecting surface section, which is directly connected to the inner end of the slope surface section at the connection.

4. The electronic apparatus according to claim 3, wherein:
the slope surface section is a first slope surface section; and
the connecting surface section includes a second slope surface section, which has an increasing cross-sectional area that progressively increases toward the inner surface of the housing wall in the penetrating direction of the ventilation hole.

5. The electronic apparatus according to claim 3, wherein the connecting surface section includes a cylindrical surface section, which has a generally constant cross-sectional area along an entire extent of the cylindrical surface section.

6. The electronic apparatus according to claim 2, wherein:
the wall surface includes the filter attachment portion having an attachment surface perpendicular to the penetrating direction of the ventilation hole between the slope surface section and the inner opening end.

7. An electronic apparatus for a vehicle, comprising:
at least one electronic device;
a waterproof housing that receives the at least one electronic device in an interior of the waterproof housing, wherein a ventilation hole penetrates through a housing wall of the waterproof housing from an inner surface to an outer surface of the housing wall in a penetrating direction thereof to communicate between an outside and an inside of the waterproof housing; and a filter that is generally planar and is attached to a filter attachment portion of the housing wall to cover the ventilation hole, wherein a wall surface of the ventilation hole includes a slope surface section that has an increasing cross-sectional area, which progressively increases from an inner end to an outer end of the slope surface section toward the outer surface of the housing wall in the penetrating direction of the ventilation hole, a distance between the filter attachment portion and the outer surface of the housing wall measured in the penetrating direction of the ventilation hole is larger than a distance between the inner end of the slope surface section and the outer surface of the housing wall measured in the penetrating direction of the ventilation hole, the slope surface section is configured such that a rate of change in the cross-sectional area of the slope surface section per unit distance in the penetrating direction of the ventilation hole is decreased toward the inner surface of the housing wall, the filter attachment portion is located in the inner surface of the housing wall around an inner opening end of the ventilation hole, which opens in the inner surface of the housing wall, the wall surface of the ventilation hole further includes a connecting surface section that has an outer end, which is directly connected to the inner end of the slope surface section at a connection, and an inner end, which forms the inner opening end of the ventilation hole, and a smallest cross-sectional area of the connecting surface section is located at the outer end of the connecting surface section, which is directly connected to the inner end of the slope surface section at the connection.

8. The electronic apparatus according to claim 7, wherein:

the slope surface section is a first slope surface section; and the connecting surface section includes a second slope surface section, which has an increasing cross-sectional area that progressively increases toward the inner surface of the housing wall in the penetrating direction of the ventilation hole.

9. The electronic apparatus according to claim 7, wherein the connecting surface section includes a cylindrical surface section, which has a generally constant cross-sectional area along an entire extent of the cylindrical surface section.

* * * * *